United States Patent [19]

Lacan

[11] 3,941,445

[45] Mar. 2, 1976

[54] ELECTRICAL CONNECTOR DEVICE
[75] Inventor: Guy Lacan, Carrieres-sous-Bois, France
[73] Assignee: La Telemecanique Electrique, Nanterre, France
[22] Filed: Apr. 8, 1974
[21] Appl. No.: 458,955

[30] Foreign Application Priority Data
Apr. 16, 1973 France .............................. 73.13809

[52] U.S. Cl. ........ 339/64 M; 339/75 M; 339/272 R
[51] Int. Cl.² ........................................ H01R 13/54
[58] Field of Search..... 339/18 B, 18 C, 18 P, 64 R, 339/64 M, 65, 66, 75 M, 75 P, 125 R, 133 R, 150 A, 162, 166 R, 91, 272, 176 MP

[56] References Cited
UNITED STATES PATENTS

| | | | |
|---|---|---|---|
| 2,993,187 | 7/1961 | Bisbing et al................. | 339/64 M X |
| 3,014,160 | 12/1961 | Brogden....................... | 339/66 R X |
| 3,042,895 | 7/1962 | Bonhomme................... | 339/64 M X |
| 3,286,671 | 11/1966 | Fuller........................... | 339/256 R X |
| 3,763,459 | 10/1973 | Millis............................ | 339/75 M |

Primary Examiner—Roy Lake
Assistant Examiner—E. F. Desmond
Attorney, Agent, or Firm—William A. Drucker

[57] ABSTRACT

The invention relates to an arrangement for connecting electrical installations or equipment to chassis containing electrical apparatus. Connectors, identical to those used within the chassis, are located on the exterior side walls of the chassis, and cooperate with a series of detachable plugs which are slidably guided into aligned cooperation with the connectors by means of ribs on the side walls, and latchingly engage with the side walls to retain them electrically interconnected with the connectors. The height of each plug is a multiple of the pitch between the rows of connector pins of the connectors, thus enabling several plugs to be plugged, side-by-side, to the same connector.

5 Claims, 3 Drawing Figures

ELECTRICAL CONNECTOR DEVICE

The invention relates to a device for making electrical connections between external apparatus and a chassis fitted with modules containing electronic circuits.

The main application of such devices is in automation systems intended for process or plant control, in which information originating from the members being controlled, and instructions intended for these members, are handled or processed in cabinets in which are mounted chassis containing the electronic circuits intended for processing the data.

There are many known devices or systems which are intended to solve the problem of connecting these various units together electrically.

In one of the known systems, the front faces of printed circuit boards in the form of removable modules are provided with contacts onto which fit sockets, the leads from which comprise collections of numbers of conductors, and run across the front panels of the chassis with which they co-operate, and thus mask a considerable proportion of the front panels of other chassis.

Also known, is an electrical connecting device employing sockets which connects external apparatus to a chassis which comprises two side walls, and an end-wall which is fitted with inter-connectors. At the rear, these interconnectors have pins onto which are intended to be wound the bare ends of conductors, and at the front they have contacts capable of co-operating with removable electrical circuits, such as those formed by printed circuits.

In this arrangement an insulating strip situated below the level of the chassis and to the rear thereof contains pins similar to those on the connectors. These pins are intended, on the one hand, to be linked to the corresponding pins on the connectors and, on the other hand, to take externally connected sockets.

This solution, which takes up an area to the rear which is very large in comparison with the effective use made of it, results in a considerable loss of useful space. Furthermore, since the sockets are only accessible from the rear, it is necessary to provide a special opening or door in the equipment.

It is, therefore, an object of the invention to provide a connecting device which is accessible from the same side as that from which the equipment contained in the chassis can be reached, but without encumbering the front panels of the equipment, the connecting device also being one which is compatible with the types of connectors used in the chassis.

In accordance with the invention, this is achieved as a result of the fact that a junction connector, similar to the inter-connectors, is fixed to the outer face of at least one of the side walls, this connector being intended to receive removable plugs, the depth of which is approximately a multiple of the distance between the contact members of the junction connector and the parallel faces of which are perpendicular to the plane of the side walls, which parallel faces are separated by a distance equivalent to the said depth. In a preferred embodiment, which facilitates external connections to the chassis, the junction connector is arranged parallel to the inter-connectors and perpendicular to series of ribs which are arranged on the side-wall to guide the plugs to the contact members.

In order that the invention may be more readily understood, reference will now be made to the accompanying drawings, in which:-

Figure 1:
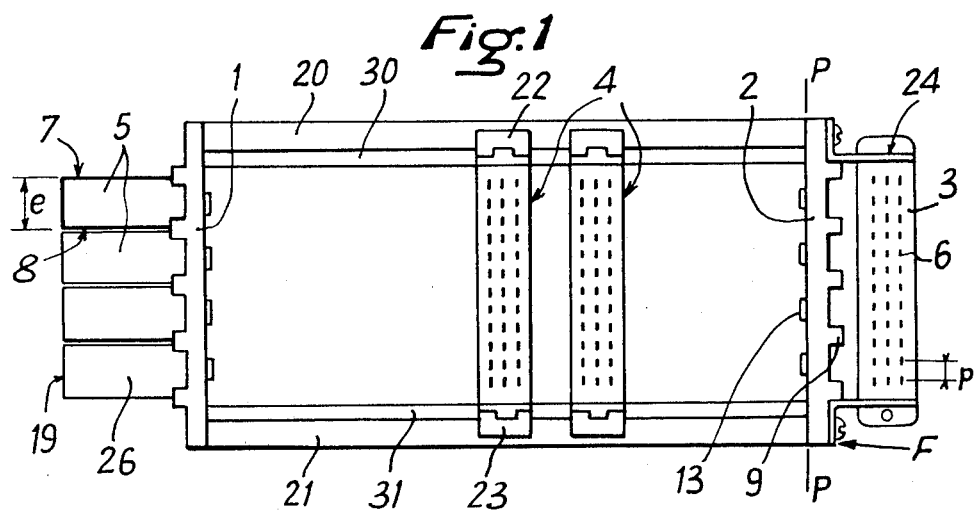
FIG. 1 is a front view of a chassis fitted on one side with plugs.

FIG. 1 is a front view of a chassis for holding electronic modules. The chassis is basically formed by two parallel side-walls 1 and 2 which are joined together by four cross pieces, two of which, 21 and 20, are situated at the front of the chassis, and two of which, 30 and 31, are situated at the rear. Plane P is the plane in which one of the side-walls is situated.

On the rear cross-pieces are arranged inter-connectors 4, the front parts of which contain contact members intended to co-operate with the corresponding members of electronic modules, and the rear parts of which contain parallel pins capable of accommodating the bared ends of electrical interconnecting conductors, which are connected, for example, by winding them around the pins. These conductors join together various pins of neighbouring connectors, certain ones of which are to be connected to external apparatus which supplies signals and receives data in return. As will be explained hereinafter, such a connection to external apparatus will be effected through a specific connector, which is termed "a junction connector" and cooperates with a plurality of plugs adapted to receive external conductors.

In the manner described in my copending Pat. application Ser. No. 458,147 filed 5th Apr., 1974, for "A Chassis Intended to Hold Electronic Circuits", the inter-connectors are held in place by supports 22 and 23 which contain slide-ways for guiding the electronic modules.

It will be noted that, at the right hand-side of FIG. 1, a connector termed a junction connector is attached externally to the face F of the chassis by means of angle brackets 24. This connector 3, which is similar to the inter-connectors 4, has, in its front face, contact members 6, the pitch of which is p, and on its rear face it has parallel pins 25, certain ones of which are electrically connected by conductors 28 to similar pins on inter-connectors 4.

Because of the similarity between them, one and the same method, or piece of apparatus, may be used to connect together corresponding pins on connectors 3 and 4.

On the left-hand side of FIG. 1 are shown a certain number of members 5, these being plugs which are so positioned as to co-operate with a junction connector (not shown) identical to the connector 3. To clarify the Figure, it has therefore been assumed that connectors such as 3 are situated on the outsides of both side-walls 1 and 2, but it is not absolutely essential for such an arrangement to be made.

Figure 2:
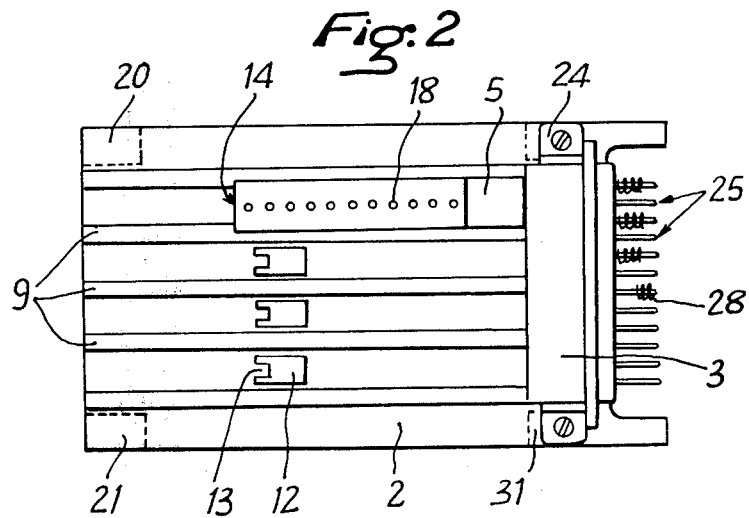
FIG. 2 is a side view of the same chassis fitted with a single plug.

FIG. 2 is a side-view of the chassis showing the side-wall 2 and the junction connector 3. A single plug 5 is shown in the position in which it co-operates with the connector.

In can be seen from this Figure, as it can from FIG. 1, that the side-wall 2 contains parallel ribs 9 which extend perpendicularly to the junction connector 3. These ribs are intended to guide the plugs 5 so as to ensure that they align accurately with the connector 3, and are thus able to plug in properly. Between pairs of neighbouring ribs 9 are formed openings 12 which also contain a tab 13. These members are intended to hold in place the plugs 5, such as the plugs shown in more detail in FIG. 3.

Figure 3:
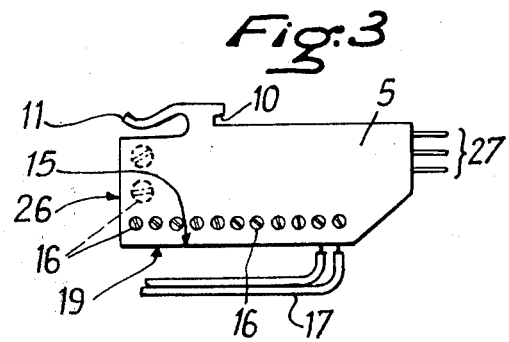
FIG. 3 is a plan view of one embodiment of the plug.

With reference to FIG. 3, one end of each plug 5 has a set of pins 27 which co-operate with the contact members 6 in the junction connector 3.

In order to ensure that the plugs are used to good advantage, each plug is made relatively shallow, so that it has a depth $e$ between its two parallel faces 7, 8 as shown in FIG. 1. This depth $e$ approximates a multiple of the pitch $p$ between the contact members 6, with the result that it is possible to fit a number of such plugs next to one another, so as to make connections to all the contact members 6 in the connector 3. If the junction connector 3 is parallel to the plane P of a side wall, the parallel faces 7 and 8 will be perpendicular to this plane P.

The plug 5, also incorporates a lug 10 and a resilient catch 11 which co-operate with one edge of the opening 12 and the tab 13, respectively, when the pins 27 are inserted into the contact members 6. For this operation, the plug 5 is also slidably guided by and between the two ribs 9.

Finally, the plug 5 is provided with fastening members 16 which ensure that there is an electrical connection between the pins 27 and the ends of externally connected conductors 17. These fastening members 16 are arranged in one of the faces 7 and 8 close to the edges 14 or 15, respectively, which are formed at the intersection between one of the faces 7 and 8 and the walls 26 and 19 perpendicular to that face, i.e. the members are arranged along the long or short side of the plug, in either the top or bottom face thereof. Part or all of the faces 26 and 19 may be occupied by apertures 18, the function of which is to receive the ends of the conductors 17. The number of fastening members 16 will naturally depend on the number of pins 27, which is itself directly dependent upon the depth $e$ of the plug.

In order to avoid too great a number of plugs being used, $e$ may be made equal to $2p$, $3p$ or $4p$ for example, depending on the number of contact members 6. In the extreme case, $e$ be made equal to $p$ if pitch ($p$) is considerable. In all cases the depth ($e$) will be such that the number of plugs capable of being fitted to a junction connector is a whole number, will also be such that the fastening members 16 can be fitted without difficulty.

IN FIGS. 1 and 2, the junction connectors 3 have been arranged parallel to the inter-connectors 4 which are themselves parallel to the plane of FIG. 1. The result is that the ribs 9 are perpendicular to the plane of FIG. 1, but this arrangement is only exemplary and is not limiting.

Two additional advantages of using individual plugs are, firstly, that the plugs may be reduced in number to suit requirements, and, secondly, that it is possible to withdraw only that plug which needs to with withdrawn, for example to carry out checks or repairs.

In addition, the side-by-side arrangement of the plugs means that each plug acts as a shield and insulator for the fastening members of the plug immediately adjacent to it.

I claim:

1. An electrical connection device for making connections between external conductors and a fixed chassis supporting a plurality of removable electrical circuits, said chassis having two parallel side faces and a rear face, the connection device comprising a plurality of interconnector members mounted at the rear face, at least one junction connector member mounted at one of the side faces, said junction connector and interconnector members being of similar construction and each having a front face and a rear face and being provided, at their rear face, with pins adapted to have wound thereonto the bared ends of conductors and, at their front face, with contact members, a plurality of removable plugs each having first and second faces perpendicular to the side faces of the chassis, said first and second faces being spaced apart by a distance which substantially equals a multiple of the pitch of the contact members in the junction connector member, said removable plugs being adapted to receive the external conductors and having pins adapted to engage the contact members of the junction connector member.

2. A connecting device according to claim 1, wherein the junction connector is arranged parallel to the interconnector members, a plurality of ribs being arranged on the side-face, at right angles to the interconnector members, said ribs being adapted for positioning the plugs with respect to the contact members.

3. A connecting device according to claim 2, wherein each plug incorporates a lug and a locking member which cooperate with an opening and a stop respectively, the opening and stop being formed between two ribs on the side face.

4. A connecting device according to claim 3, wherein each plug has third and fourth faces perpendicular to said first and second faces, said fourth face being fitted with the said pins and, on said first face and adjacent one edge thereof, a plurality of fastening members and, in said third face, a plurality of apertures adapted to receive electrical conductors, said fastening members cooperating with said apertures for retaining said external conductors therein.

5. A connecting device according to claim 3 wherein the side-walls are extruded profiled members.

* * * * *